United States Patent
Reber et al.

(10) Patent No.: US 10,262,893 B2
(45) Date of Patent: Apr. 16, 2019

(54) METHOD OF FORMING INTER-LEVEL DIELECTRIC STRUCTURES ON SEMICONDUCTOR DEVICES

(71) Applicant: NXP USA, INC., Austin, TX (US)

(72) Inventors: Douglas M. Reber, Austin, TX (US); Mehul D. Shroff, Austin, TX (US)

(73) Assignee: NXP USA, INC., Austin, TX (US)

( * ) Notice: Subject to any disclaimer, the term of this patent is extended or adjusted under 35 U.S.C. 154(b) by 11 days.

(21) Appl. No.: 15/723,374

(22) Filed: Oct. 3, 2017

(65) Prior Publication Data

US 2018/0047616 A1 Feb. 15, 2018

Related U.S. Application Data

(62) Division of application No. 14/687,360, filed on Apr. 15, 2015, now Pat. No. 9,818,642.

(51) Int. Cl.
| | |
|---|---|
| H01L 21/768 | (2006.01) |
| H01L 23/522 | (2006.01) |
| H01L 23/532 | (2006.01) |

(52) U.S. Cl.
CPC ...... *H01L 21/7682* (2013.01); *H01L 21/7688* (2013.01); *H01L 21/76834* (2013.01); *H01L 21/76873* (2013.01); *H01L 21/76874* (2013.01); *H01L 23/5222* (2013.01); *H01L 23/53223* (2013.01); *H01L 23/53238* (2013.01); *H01L 23/53276* (2013.01); *H01L 23/53295* (2013.01); *H01L 21/76885* (2013.01)

(58) Field of Classification Search
None
See application file for complete search history.

(56) References Cited

U.S. PATENT DOCUMENTS

| | | | |
|---|---|---|---|
| 5,324,683 A | 6/1994 | Fitch et al. | |
| 6,307,265 B1 | 10/2001 | Anand et al. | |
| 6,387,818 B1 | 5/2002 | Lopatin | |
| 6,423,629 B1 | 7/2002 | Ahn et al. | |
| 6,509,623 B2 | 1/2003 | Zhao | |
| 8,742,478 B2 | 6/2014 | Chung et al. | |
| 9,818,642 B2 * | 11/2017 | Reber | H01L 21/76873 |

OTHER PUBLICATIONS

Chandler, D., "A new way to make sheets of graphene, Technique might enable advances in display screens, solar cells, or other devices"; MIT News Office, May 23, 2014.

(Continued)

*Primary Examiner* — Robert K Carpenter (57) ABSTRACT

A semiconductor device and a method for making the semiconductor device are provided. The method of making the semiconductor device may include patterning a layer for a first conductor and a second conductor, plating patterned portions of the layer to form the first conductor and the second conductor, removing patterned material to form an air gap between the first conductor and the second conductor, applying a self-supporting film on top of the first conductor and the second conductor to enclose the air gap, and reacting the self-supporting film causing the self-supporting film to be substantially non-conductive.

20 Claims, 5 Drawing Sheets

(56) References Cited

OTHER PUBLICATIONS

Frank, I.W., et al., "Mechanical properties of suspended graphene sheets"; http://www.lassp.cornell.edu/lassp_data/mceuen/homepage/Publications/JVSTB_Pushing_Graphene.pdf; 2007 American Vacuum Society, J. Vac. Sci. Technol. B 25(6), Nov./Dec. 2007.

Gomez De Arco, L., et al., "Continuous, Highly Flexible, and Transparent Graphene Films by CVD for Organic Photovoltaics", ACS Nano Publications, 2010, 4 (5), pp. 2865-2873, doi: 10.1021/nn901587x; 2010 American Chemical Society.

Johnson. D., "First Wafer-Scale, Single-Crystal, Monolayer Graphene Made in Bulk"; http://spectrum.ieee.org/nanoclast/semiconductors/materials/singlecrystal-monolayer-graphene-produced-in-bulk-for-first-time; Apr. 4, 2014.

Johnson, R. C., "Graphene wafers ready to fab carbon chips"; http://www.eetimes.com/document.asp?doc_id=1172918, EETimes Feb. 1, 2010.

Kim, B., et al., "Three dimensional graphene foam based transparent conductive electrodes in GaN based blue light-emitting diodes", Applied Physics Letters, 2013, vol. 102, Issue 16, 161902 (2013); doi: 10.1063/1.4801763, Apr. 2013.

Kim, K., "A role for graphene in silicon-based semiconductor devices", http://www.nature.com/nature/journal/v479/n7373/full/nature 10680.html, Nature: International weekly journal of science, vol. 479, Issue 7373, Nov. 17, 2011, Figure 1.

Korczynski, E., "Air-gaps in Copper Interconnects for Logic", http://semimd.com/blog/2014/10/31/air-gaps-in-copper-interconnects-for-logic/, Oct. 31, 2014.

Miao, X., et al., "High Efficiency Graphene solar Cells by Chemical Doping", Nano Letters Publications; May 3, 2012, 12 (6), pp. 2745-2750; doi: 10.1021/nl204414u; 2012 American Chemical Society.

"Breakthrough synthesis method to speed commercialization of graphene"; http://phys.org/news/2014-04-breakthrough-synthesis-method-commercialization-graphene.html#jCp, Apr. 6, 2014.

"Graphene" from Wikipedia; http://en.wikipedia.org/wiki/Graphene; downloaded Jun. 29, 2017.

Monolayer Graphene on PET (4" Wafer); http://www.graphenea.com/products/monolayer-graphene-on-pet-60-mm-x-40-mm, downloaded Jun. 29, 2017.

* cited by examiner

METHOD OF FORMING INTER-LEVEL DIELECTRIC STRUCTURES ON SEMICONDUCTOR DEVICES

This application is a divisional application of a U.S. patent application entitled "METHOD OF FORMING INTER-LEVEL DIELECTRIC STRUCTURES ON SEMICONDUCTOR DEVICES", having a Ser. No. of 14/687,360, having a filing date of Apr. 15, 2015, having common inventors, and having a common assignee, all of which is incorporated by reference in its entirety.

BACKGROUND

Field

This disclosure relates generally to semiconductor devices, and more specifically, to inter-level dielectric structures formed on semiconductor devices.

Related Art

Modern integrated circuits typically have conductors formed on multiple interconnect layers to accommodate dense circuitry. These conductors can be used to transfer information in the form of signals across integrated circuits. With higher performance demands, signals traversing the conductors can be required to move at very high frequencies. However, as geometries of semiconductor devices get smaller, spacing between conductors gets smaller. Smaller spacing between conductors generally causes increased parasitic capacitance impacting the speed and power of integrated circuits. Another negative aspect of increased parasitic capacitance can be increased signal crosstalk between adjacent and parallel conductors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Semiconductor devices and methods are disclosed in which inter-level dielectrics are formed to reduce the parasitic capacitance between conductors. Reducing the parasitic capacitance between conductors allows for higher signal frequencies while reducing unwanted crosstalk with adjacent and parallel signals. The present disclosure describes a method of forming air gap inter-level dielectrics between conductors in a semiconductor device.

FIGS. 1-7 illustrate cross-sectional views at different stages of manufacture of a semiconductor device 100 having an inter-level dielectric formed in accordance with an embodiment of the present disclosure. Conductors are formed over a substrate allowing an air gap to be formed between the conductors. The substrate may include an insulating layer covering a component formed on the substrate in the semiconductor device. A self-supporting film is applied to enclose the air gap between the conductors, allowing subsequent interconnect conductors to be formed above the air gap conductors.

Figure 1:
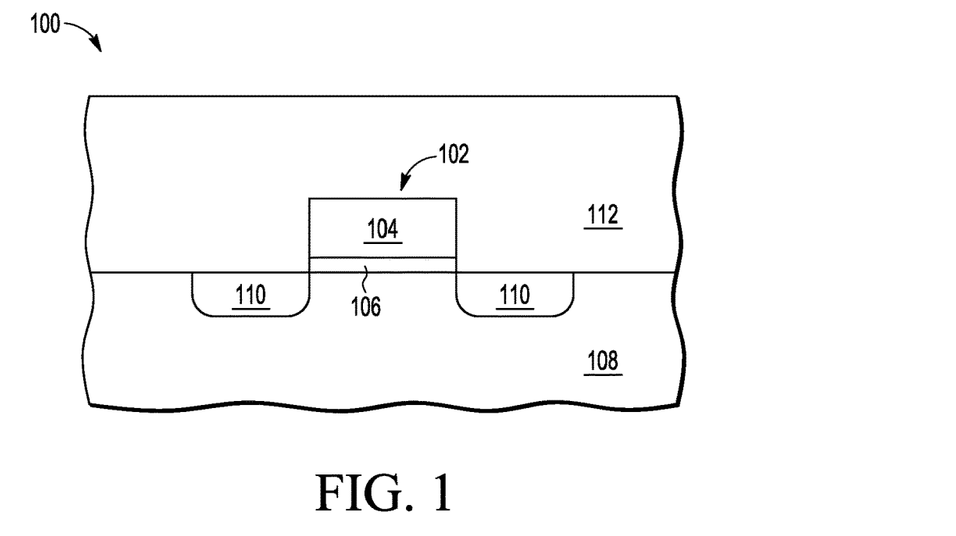
FIG. 1 through FIG. 7 illustrate cross-sectional views at different stages of manufacture of a semiconductor device having an inter-level dielectric formed in accordance with an embodiment of the present disclosure.

FIG. 1 shows a cross sectional view of semiconductor device 100 having a transistor 102 formed on a substrate 108. Transistor 102 is shown for example purposes however, other semiconductor components are anticipated in the present disclosure such as resistors, capacitors, diodes, and the like. Transistor 102 can be any type of transistor such as a metal-oxide-semiconductor (MOS) transistor, a bipolar junction transistor (BJT), and the like. Substrate 108 can be any semiconductor material or combinations of materials, such as gallium arsenide, silicon germanium, semiconductor-on-insulator (SOI), silicon, monocrystalline silicon, the like, and combinations of the above. In the embodiment shown, transistor 102 includes a gate terminal 104 formed on gate dielectric 106. Gate terminal 104 typically includes a polysilicon material but may include any suitable conductive material. Gate dielectric 106 can be any suitable dielectric material such as a grown or deposited oxide material. Transistor 102 includes source/drain regions 110 formed on opposing sides of gate terminal 104. Insulating layer 112 (e.g. an oxide) covers transistor 102 and isolates transistor 102 from interconnect conductors generally formed on insulating layer 112. Transistor 102 may include other details not shown in FIG. 1 such as a gate terminal contact, source/drain terminal contacts, source/drain extension implants and/or sidewall spacers, and the like.

Figure 2:
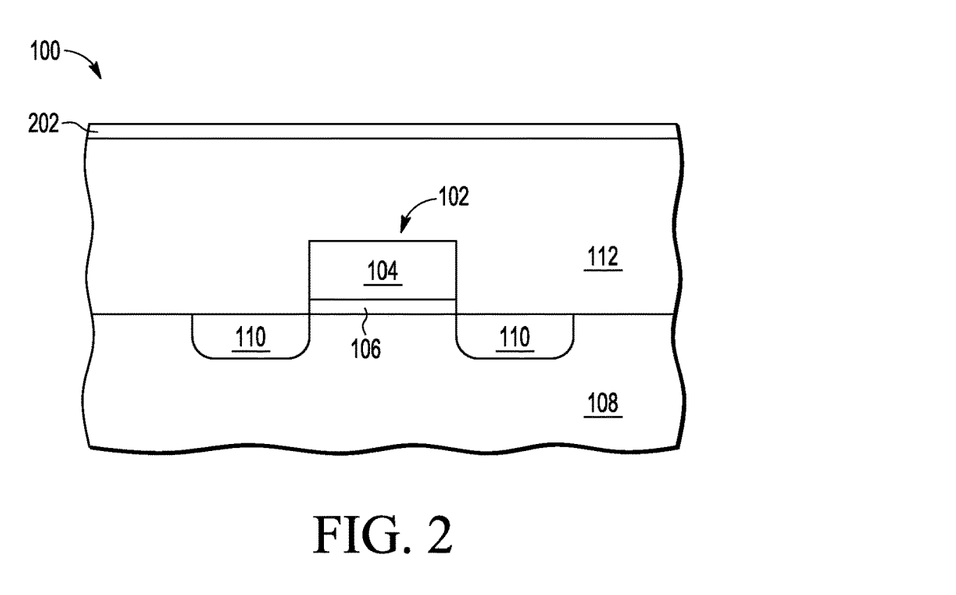

FIG. 2 shows semiconductor device 100 after seed layer 202 is formed on insulating layer 112. Seed layer 202 can be any suitable material used for plating or metallization such as a thin layer of copper sputtered or chemical vapor deposited (CVD) on the insulating layer 112. Seed layer 202 may include a barrier layer. The barrier layer may include titanium, titanium nitride, tantalum, tantalum nitride, or any suitable material used as a barrier. The barrier layer can be required when forming copper conductors to prevent diffusion of copper into surrounding materials.

Figure 3:
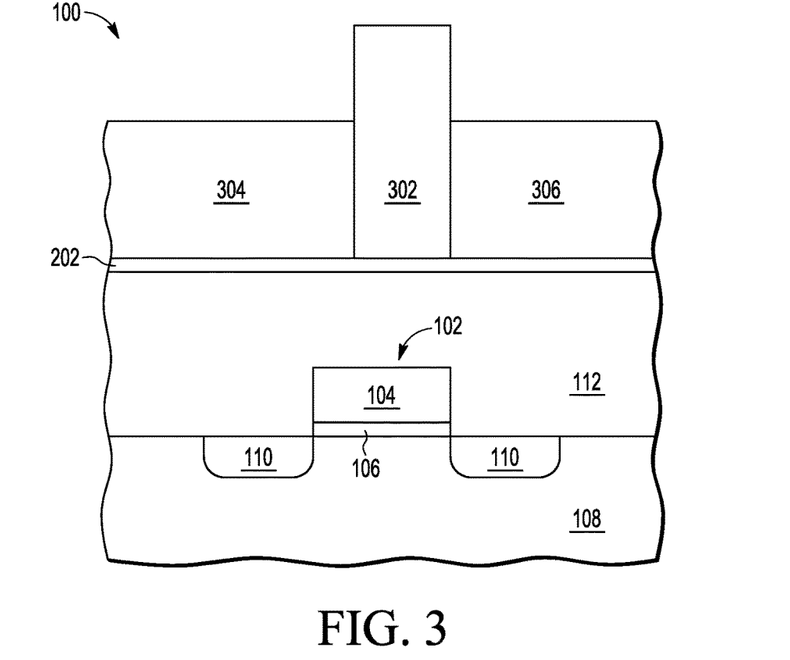

FIG. 3 shows semiconductor device 100 after a first conductor 304 and a second conductor 306 are formed on seed layer 202. First conductor 304 or second conductor 306 may be coupled (not shown) to an electrode or terminal of an underlying component such as the gate or a source/drain terminal of transistor 102, for example. To form conductors 304 and 306, a resist material 302 is patterned on the seed layer 202. Exposed portions of the seed layer 202, or areas where the resist material 302 was removed from the seed layer 202, are plated. Portions of the seed layer 202 that remain covered by the resist material 302 are not be plated. The resist material 302 can be any material suitable for photolithography such as a photoresist. Plating exposed portions of the seed layer 202 to form the first conductor 304 and the second conductor 306 can include electroplating with copper, for example. First conductor 304 and second conductor 306 may be formed with any suitable material such as a copper material, a silver material, an aluminum material, a graphene material, and the like, for example.

Figure 4:
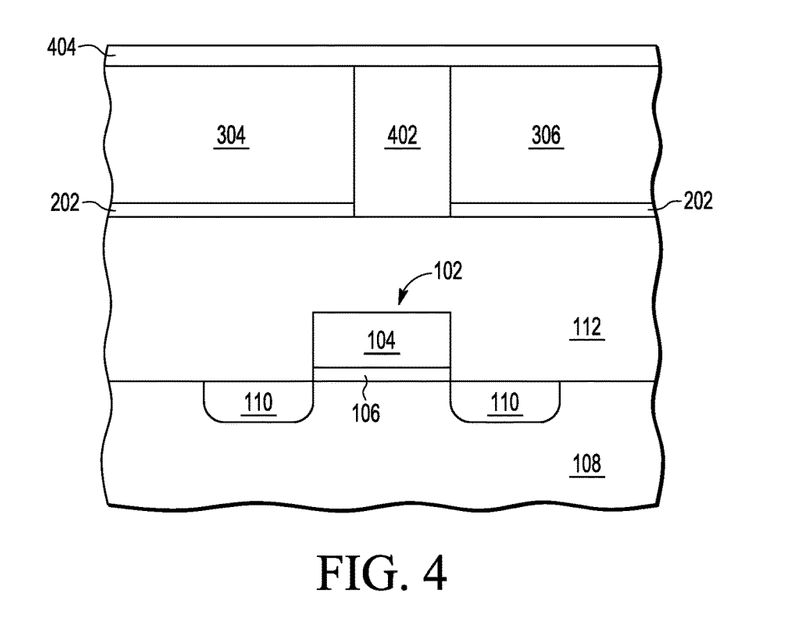

FIG. 4 shows semiconductor device 100 after an air gap 402 is formed between the first conductors 304 and the second conductor 306. After plating the exposed portions of the seed layer 202, resist material 302 remains between the first conductor 304 and the second conductor 306. An air gap is formed between the first conductor 304 and the second conductor 306 when the remaining resist material 302 and the underlying portion of the seed layer 202 are removed.

In some embodiments, after the resist material 302 is removed, an additional layer can be deposited (not shown).

The additional layer may be formed as a protecting or barrier coating layer. In some embodiments, the additional layer can include a conductive material such as titanium nitride or tantalum nitride, for example. In some embodiments, the additional layer can include a dielectric material such as tetraethylorthosilicate (TEOS) formed dielectric, for example. The additional layer would remain on the surrounding sidewall surfaces of air gap 402 after a subsequent anisotropic etch to remove the portions of the additional layer on layer 102 in air gap 402.

Referring back to FIG. 3, the first conductor 304 and the second conductor 306 may be formed using a damascene or inlaid process. In some embodiments, an intermediate layer such as a dielectric can be deposited on the insulating layer 112, then patterned with a resist. Patterned portions defining the first conductor 304 and the second conductor 306 of the intermediate layer are etched. A seed layer and barrier layer can be deposited in the etched portions of the intermediate layer then electroplated with copper to form conductors 304 and 306. After electroplating with copper, a planarization process may follow such as chemical-mechanical polishing (CMP) to remove excess conductor material. After the conductors 304 and 306 are formed, the intermediate layer is selectively etched to form an air gap 402 between conductors 304 and 306.

After the air gap 402 is formed between the first conductor 304 and the second conductor 306, a self-supporting film 404 is applied on top of the first conductor 304 and the second conductor 306 enclosing the air gap 402. The self-supporting film 404 may be applied in sheet form covering an entire wafer and bonded. In some embodiments, an adhesion layer may be deposited on the self-supporting film 404 prior to bonding. In some embodiments, the self-supporting film 404 may be applied to a die or to a portion of a die. The self-supporting film 404 can include a graphene material, a silicene material, or any material which can span air gaps between conductors without significant sag.

Graphene, for example, is a monolayer of bonded carbon atoms in sheet form. A graphene sheet can be applied to a semiconductor wafer by mechanically positioning the graphene sheet onto the semiconductor wafer. After the graphene sheet is positioned, the graphene sheet can be chemically bonded, electrostatically bonded, van der Walls bonded, or the like, for example. A graphene sheet can also be applied to a semiconductor wafer by first attaching the graphene sheet to a handle wafer for mechanical support. After the graphene sheet is attached to a handle wafer, the handle wafer can be positioned onto the semiconductor wafer with the graphene sheet surface facing the semiconductor wafer. After the handle wafer is positioned, the graphene sheet surface can be bonded to the semiconductor wafer. After bonding the graphene sheet surface to the semiconductor wafer, the backside of the handle wafer can be thinned, for example, by cleaving to remove a predetermined portion of the handle wafer followed by a CMP process. In some embodiments, the attachment of the graphene sheet to the handle wafer can use a temporary adhesive layer from which the graphene sheet can be detached after having been bonded to the semiconductor wafer.

Figure 5:
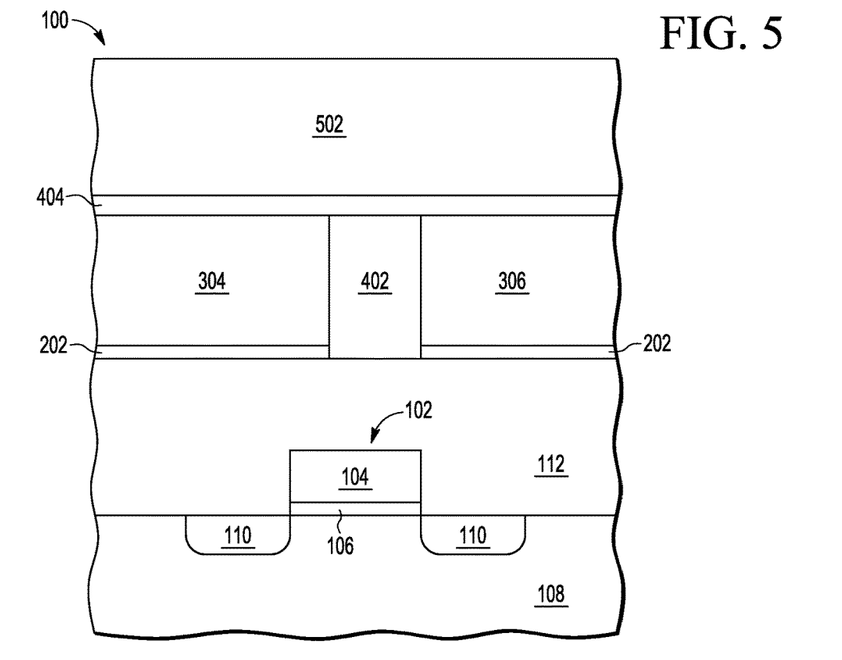

FIG. 5 shows semiconductor device 100 after a dielectric layer 502 is deposited on the self-supporting film 404. Dielectric layer 502 is deposited at a temperature below the reaction temperature of the self-supporting film 404. For example, the dielectric layer 502 deposition temperature should be below approximately 400° C. when the self-supporting film 404 includes a graphene material. Dielectric layer 502 may be deposited using a chemical vapor deposition (CVD) process. Dielectric layer 502 may include any suitable material for forming an inter-level dielectric layer such as a tetraethylorthosilicate (TEOS) formed dielectric, a carbon doped oxide material (SiCOH), or any low-k material. A low-k material is generally a material having a dielectric constant lower than the dielectric constant of silicon dioxide.

Figure 6:
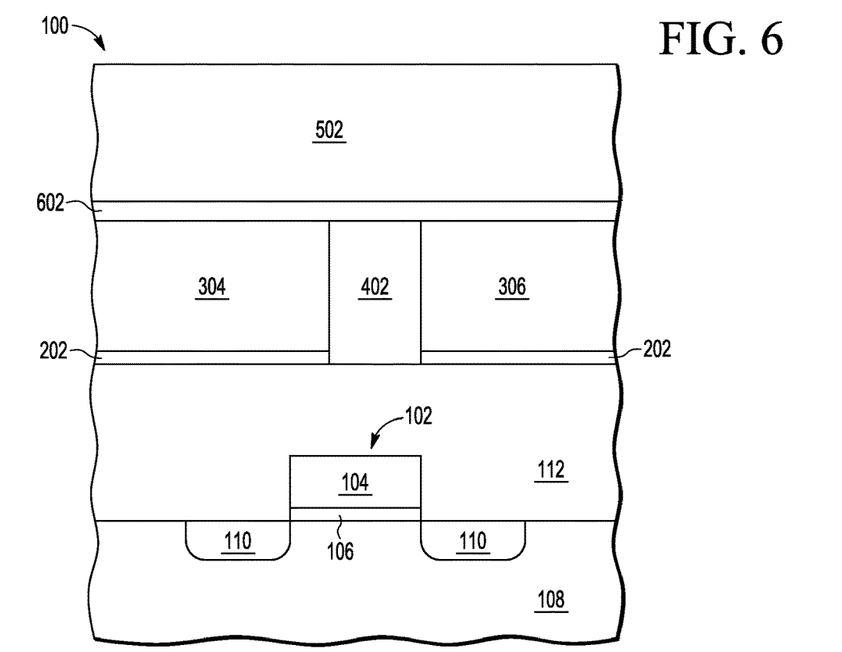

FIG. 6 shows semiconductor device 100 after dielectric layer 502 is reacted with self-supporting film 404. Dielectric layer 502 is reacted with self-supporting film 404 by to cause the self-supporting film 404 to be a substantially non-conductive or a high resistance self-supporting film 602. For example, a graphene self-supporting film when reacted with an oxygen based dielectric material can form graphene oxide (GO). The reaction process to form GO can be caused by subjecting the graphene self-supporting film and oxygen based dielectric to a thermal or plasma treatment, for example. Graphene has a very low sheet resistivity and can be as conductive as silver. Forming graphene oxide, however, can convert a conductive graphene material to a non-conductive material graphene oxide material. The conductivity of graphene oxide generally depends on the degree of oxidation. Graphene oxide can be characterized as non-conductive for lower graphene-to-oxygen ratios, such as approximately 2:1 and less. For higher ratios, such as 6:1 and greater, graphene oxide can be characterized as conductive.

Figure 7:
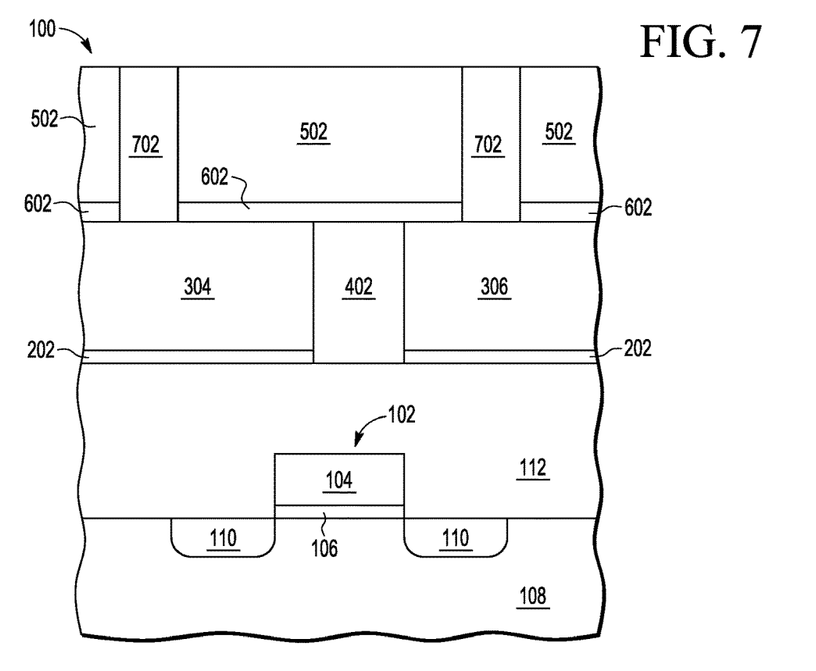

FIG. 7 shows semiconductor device 100 after vias 702 are formed in dielectric layer 502. Dielectric layer 502 is patterned for one or more via openings. Patterning may include forming a patterned coating of a photoresist material on dielectric layer 502, defining portions of the dielectric layer 502 for one or more via openings. For example, when dielectric layer 502 is patterned for via openings, the patterned photoresist material may be formed leaving portions of dielectric layer 502 exposed or uncovered by the photoresist material. After the dielectric layer 502 is patterned, the exposed or uncovered portions defining the via openings can be etched forming via hole through dielectric layer 502 and through the reacted self-supporting film 602, exposing a portion of first conductor 304 and second conductor 306. After the via holes are formed, exposed portions of first conductor 304 and second conductor 306 can be plated, filling the via holes and thus, forming vias 702. For example, the plating process may include electroplating copper in the via holes to form vias 702. In some embodiments, after vias 702 are formed, portions of the dielectric layer 502 may be selectively removed to form an air gap (not shown) between vias 702. Conductors (not shown) may be formed on top of vias 702 to electrically connect to first conductor 304 or second conductor 306.

Figure 8:
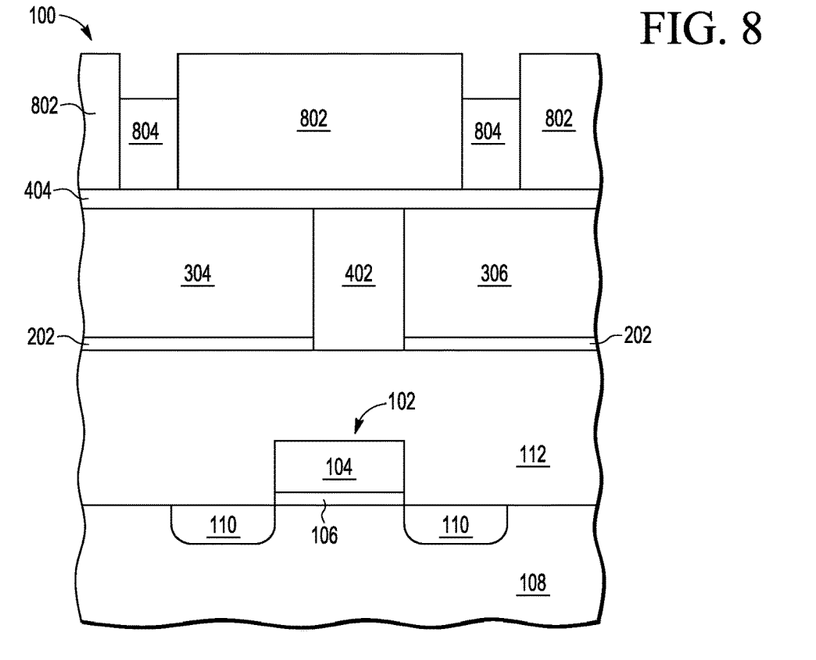
FIG. 8 through FIG. 10 illustrate cross-sectional views at different stages of manufacture of a semiconductor device having a subsequent inter-level dielectric formed in accordance with an embodiment of the present disclosure.

FIG. 8 shows semiconductor device 100 after using an alternative method of forming vias to the first conductor 304 or the second conductor 306. The alternative method of forming vias may be done in place of the process steps illustrated in FIGS. 5-7. A resist material 802 is patterned on the self-supporting film 404 (FIG. 4), leaving portions of the self-supporting film 404 exposed or uncovered by the resist material 802. The exposed portions of the self-supporting film 404 can be plated to form vias 804. In some embodiments, a seed layer can be deposited on the exposed portions of the self-supporting film 404 before plating the vias 804. The plating process may include electroplating copper to form vias 804. In some embodiments, a barrier layer may be deposited in addition to the seed layer when electroplating copper, for example.

Figure 9:
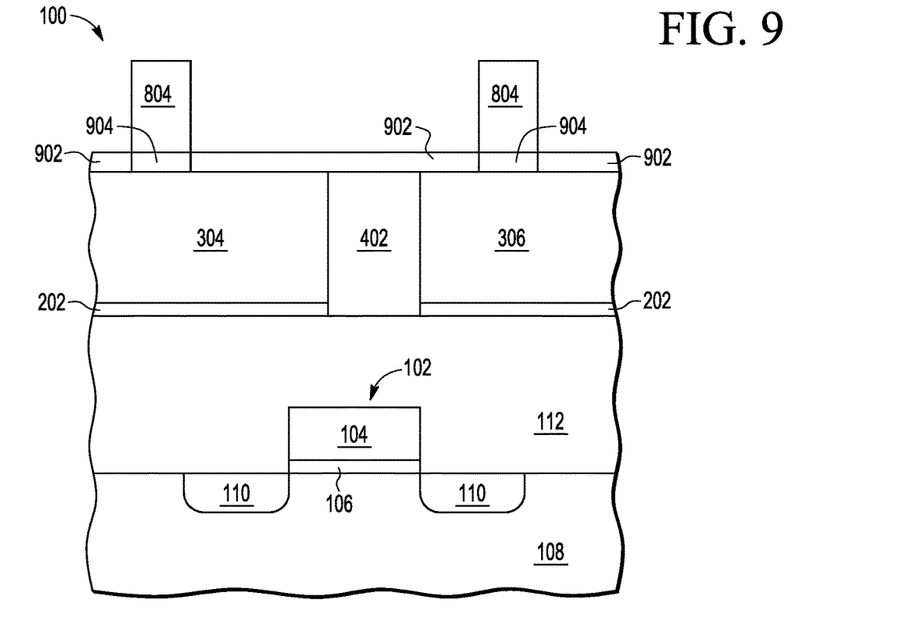

FIG. 9 shows semiconductor device 100 after resist material 802 is removed to form an air gap between vias 804. After the resist material 802 is removed, the self-supporting film 404 may be subjected to a thermal or plasma treatment to react exposed portions of the self-supporting film 404 to form a substantially non-conductive or highly resistive self-supporting film 902. Portions of the self-supporting film covered by the vias 804 remain as conductive self-supporting film portions 904.

Figure 10:
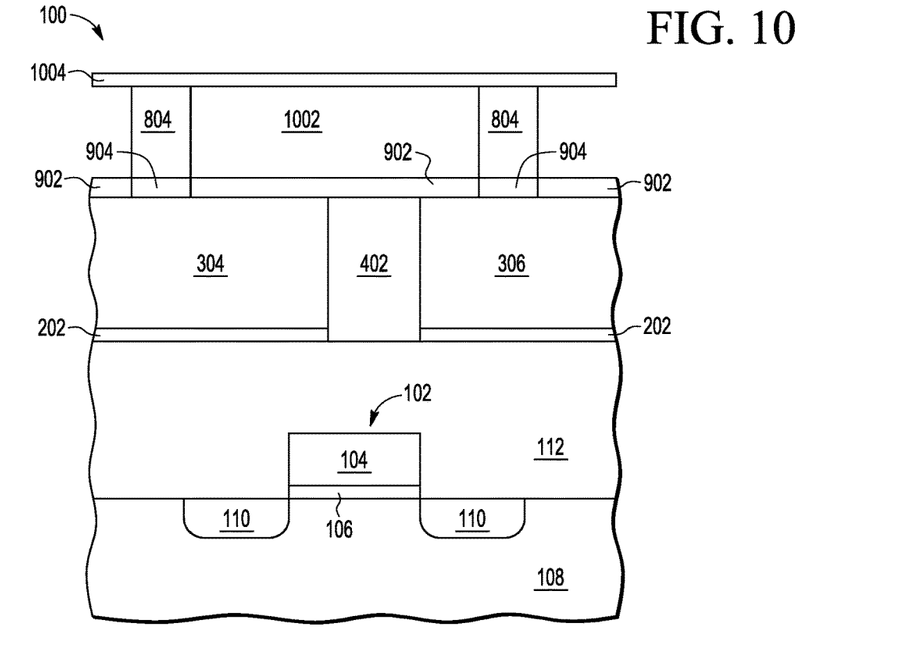

FIG. 10 shows semiconductor device 100 after a second self-supporting film 1004 is applied enclosing air gap 1002 between vias 804. The second self-supporting film 1004 may be applied in sheet form covering an entire wafer and bonded. In some embodiments, an adhesion layer may be deposited on the second self-supporting film prior to bonding. The second self-supporting film 1004 can include a graphene material or a silicene material, for example. In some embodiments, subsequent conductors and interconnect layers may be formed on the second self-supporting film 1004.

Generally, there is provided, a method for making a semiconductor device including: depositing a first layer over a substrate; patterning a resist material on the first layer for a first conductor and a second conductor; plating patterned portions of the first layer to form the first conductor and the second conductor; removing the resist material to form an air gap between the first conductor and the second conductor; applying a first self-supporting film over the first conductor and the second conductor to enclose the air gap; and reacting the first self-supporting film causing the first self-supporting film to be substantially non-conductive. The first self-supporting film may include a graphene material. The plating may further include depositing a seed layer on patterned portions of the first layer, and electroplating the seed layer with a copper material or a silver material. The substrate may further include an insulating layer covering a transistor formed on the substrate. The method may further include: patterning a resist material on the first self-supporting film leaving exposed portions for a first via and a second via; plating exposed portions of the first self-supporting film to form the first via and the second via; removing the resist material to form an air gap between the first via and the second via; and applying a second self-supporting film over the first via and the second via to enclose the air gap. The method may further include: depositing a coating layer after removing the resist material to form the air gap; and anisotropically etching the coating layer to form a coating on surrounding sidewall surfaces of the air gap. The method may further include depositing a second layer over the first self-supporting film, and wherein reacting the first self-supporting film includes reacting the first self-supporting film with the second layer causing the first self-supporting film to be substantially non-conductive. The second layer may include a tetraethylorthosilicate (TEOS) formed dielectric material or a carbon doped oxide dielectric material (SiCOH). The may further include: patterning the second layer for a via opening over the first conductor or the second conductor; etching the second layer to form the via opening exposing a portion of the first conductor or the second conductor; and electroplating copper on the exposed portion of the first conductor or the second conductor to form a via by filling the via opening.

In another embodiment, there is provided, a method for making a semiconductor device including: depositing a first layer over a substrate; depositing a second layer on the first layer; patterning the second layer to expose portions of the first layer for a first conductor and a second conductor; depositing a first seed layer on the exposed portions of the first layer; plating the first seed layer to form the first conductor and the second conductor; selectively removing the second layer to form an air gap between the first conductor and the second conductor; depositing a first self-supporting film over the first conductor and the second conductor to enclose the air gap; depositing a third layer over the first self-supporting film; and reacting the first self-supporting film with the third layer causing the first self-supporting film to be substantially non-conductive. The first self-supporting film may include a graphene material or a silicene material. The first seed layer may include a copper material and either a titanium nitride material or a tantalum nitride material. The method may further include: patterning the third layer for a via opening above the first conductor or the second conductor; etching the third layer to form the via opening exposing a portion of the first conductor or the second conductor; and plating the exposed portion of the first conductor or the second conductor to fill the via opening. The substrate may further include an insulating layer covering a metal-oxide-semiconductor (MOS) transistor formed on the substrate. Plating the first seed layer may include electroplating copper on the seed layer to form the first conductor and the second conductor. The method may further include: patterning a resist material on the first self-supporting film leaving exposed portions for a first via and a second via; depositing a second seed layer on the exposed portions of the first self-supporting film; plating the second seed layer to form the first via and the second via; removing the resist material to form an air gap between the first via and the second via; and depositing a second self-supporting film over the first via and the second via to enclose the air gap. The method may further include reacting the second self-supporting film with a thermal treatment or a plasma treatment causing the second self-supporting film to be substantially non-conductive.

In yet another embodiment, there is provided, a semiconductor device including: a first conductor formed over a substrate; a second conductor formed over the substrate, the second conductor being separated from the first conductor by an air gap; a self-supported film applied over the first conductor and the second conductor enclosing the air gap between the first conductor and the second conductor; and an insulating layer covering the self-supported film, the insulating layer reacted with the self-supported film causing the self-supported film to be substantially non-conductive. The self-supported film may include a graphene material. The first conductor and the second conductor may include a copper material, a silver material, an aluminum material, or a graphene material.

By now it should be appreciated that there has been provided semiconductor devices and methods in which air gap inter-level dielectrics are formed to reduce the parasitic capacitance between conductors. Reducing the parasitic capacitance between conductors allows for higher operating signal frequencies while reducing unwanted crosstalk with neighboring signals.

The semiconductor substrate described herein can be any semiconductor material or combinations of materials, such as gallium arsenide, silicon germanium, silicon-on-insulator (SOI), silicon, monocrystalline silicon, the like, and combinations of the above.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a first conductor formed over a substrate;
   a second conductor formed over the substrate, the second conductor being separated from the first conductor by an air gap;
   a self-supported film applied over the first conductor and the second conductor enclosing the air gap between the first conductor and the second conductor; and
   an insulating layer covering the self-supported film, the insulating layer reacted with the self-supported film causing the self-supported film to be non-conductive.

2. The semiconductor device of claim 1, wherein the self-supported film includes a graphene material.

3. The semiconductor device of claim 1, wherein the first conductor and the second conductor include a copper material, a silver material, an aluminum material, or a graphene material.

4. The semiconductor device of claim 1, wherein at least a portion of the first conductor and the second conductor comprise a plated material.

5. The semiconductor device of claim 1, further comprising a dielectric layer disposed between a bottom of the first and second conductors and a transistor formed on the substrate.

6. The semiconductor device of claim 1, further comprising a via formed through the insulating layer and self-supported film, the via connected to the first or the second conductor.

7. The semiconductor device of claim 6, wherein the via formed comprises a seed layer portion and a plated portion.

8. A semiconductor device comprising:
   a first layer deposited over a substrate, the first layer patterned to form a first conductor and a second conductor;
   an air gap disposed between the first conductor and the second conductor;
   a self-supported film applied over the first and second conductors enclosing the air gap; and
   an insulating layer covering the self-supported film, the insulating layer reacted with the self-supported film causing the self-supported film to be non-conductive.

9. The semiconductor device of claim 8, wherein the first layer comprises a seed layer, and wherein the first and second conductor are formed by electroplating portions of the seed layer with copper.

10. The semiconductor device of claim 8, wherein the self-supported film comprises a graphene material.

11. The semiconductor device of claim 8, further comprising a dielectric layer disposed between a bottom surface of the first and second conductors and a transistor formed on the substrate.

12. The semiconductor device of claim 8, further comprising a via formed through the insulating layer and self-supported film, the via connected to the first or the second conductor.

13. The semiconductor device of claim 12, wherein the via formed comprises a seed layer portion and a plated portion.

14. A semiconductor device comprising:
    a first dielectric layer formed over a substrate;
    a first layer deposited on the dielectric layer, the first layer patterned to form a first conductor and a second conductor;
    a first air gap disposed between the first conductor and the second conductor;
    a self-supported film applied over the first and second conductors enclosing the first air gap; and
    a second dielectric layer covering the self-supported film, the second dielectric layer reacted with the self-supported film causing the self-supported film to be non-conductive.

15. The semiconductor device of claim 14, wherein the first layer comprises a seed layer, and wherein the first and second conductor are formed by electroplating portions of the seed layer with copper.

16. The semiconductor device of claim 14, wherein the self-supported film comprises a graphene material.

17. The semiconductor device of claim 14, wherein the first dielectric layer is formed over a transistor formed on the substrate.

18. The semiconductor device of claim 14, further comprising a first via formed through the second dielectric layer and self-supported film, the first via connected to the first conductor.

19. The semiconductor device of claim 18, wherein the first via formed comprises a seed layer portion and a plated portion.

20. The semiconductor device of claim 18, further comprising a second via formed through the second dielectric layer and self-supported film, a second air gap disposed between the first via and the second via.

* * * * *